(12) United States Patent
Siewert et al.

(10) Patent No.: US 12,048,130 B2
(45) Date of Patent: Jul. 23, 2024

(54) COOLING DEVICE FOR DISSIPATING HEAT

(71) Applicant: Erwin Quarder Systemtechnik GmbH, Espelkamp (DE)

(72) Inventors: Georg Siewert, Pohlheim (DE); Alexander Heitbrink, Stemwede (DE); Stefan Bruns, Osnabrück (DE)

(73) Assignee: Erwin Quarder Systemtechnik GmbH, Espelkamp (DE)

( * ) Notice: Subject to any disclaimer, the term of this patent is extended or adjusted under 35 U.S.C. 154(b) by 96 days.

(21) Appl. No.: 17/741,790

(22) Filed: May 11, 2022

(65) Prior Publication Data

US 2022/0369496 A1 Nov. 17, 2022

(30) Foreign Application Priority Data

May 12, 2021 (DE) .......................... 102021112415.8

(51) Int. Cl.
*H05K 7/20* (2006.01)

(52) U.S. Cl.
CPC ......... *H05K 7/209* (2013.01); *H05K 7/20927* (2013.01)

(58) Field of Classification Search
CPC ........ H05K 7/1432; H05K 7/20; H05K 7/209; H05K 7/20218; H05K 7/20254–20263;
(Continued)

(56) References Cited

U.S. PATENT DOCUMENTS 3,882,934 A * 5/1975 Knoos ....................... F28F 3/08
165/170
5,001,548 A * 3/1991 Iversen ................. H01L 23/473
257/E23.098
(Continued)

FOREIGN PATENT DOCUMENTS

CN 109548363 A * 3/2019
DE 102004012026 B3 11/2005
(Continued)

OTHER PUBLICATIONS

CN-109548363-A English Translation (Year: 2019).*
(Continued)

*Primary Examiner* — Amir A Jalali
(74) *Attorney, Agent, or Firm* — Laurence P. Colton; Smith Tempel Blaha LLC (57) ABSTRACT

A cooling device for dissipating heat from articles to be cooled, such as power electronic modules, having at least one preferably rigid heat sink which consists in particular of solid material, preferably composed of metal, for example composed of aluminium, and which is intended to absorb heat from one or more articles to be cooled, and having a cooling fluid chamber for accommodating cooling fluid, in particular cooling liquid, to which the heat absorbed by the heat sink can be transferred. The cooling device has at least two preferably rigid heat sinks which consist in particular of solid material and which are connected to one another in an articulated manner, in particular by way of a heat sink joint, in such a way that the two heat sinks are movable relative to one another in different, in particular parallel planes.

14 Claims, 4 Drawing Sheets

(58) Field of Classification Search
CPC ............. H05K 7/2039; H05K 7/20427; H05K 7/20454; H05K 7/20509; H05K 7/20845; H05K 7/2089; H05K 7/20927–20936; H05K 2201/06; H05K 2201/10166; H01L 23/3142; H01L 23/32; H01L 23/367; H01L 23/3672; H01L 23/40; H01L 23/4338; H01L 23/467; H01L 23/473; H01L 25/072; H01L 2023/4031; H01L 2023/4081–4087

See application file for complete search history.

(56) References Cited

U.S. PATENT DOCUMENTS

| | | | |
|---|---|---|---|
| 5,150,274 A | 9/1992 | Okada | |
| 6,111,749 A | 8/2000 | Lamb | |
| 11,058,030 B2* | 7/2021 | Tian | ................... H05K 7/20772 |
| 2011/0286179 A1 | 11/2011 | Motschman | |
| 2011/0317368 A1* | 12/2011 | Pautsch | ................. H01L 23/473 |
| | | | 361/702 |
| 2012/0080785 A1 | 4/2012 | Johnson | |
| 2016/0290728 A1* | 10/2016 | Coteus | ............... H05K 7/20254 |
| 2019/0259632 A1* | 8/2019 | Isaacs | ................ H01L 23/3677 |
| 2019/0301809 A1* | 10/2019 | Cook | ........................ F28F 3/12 |
| 2021/0059068 A1* | 2/2021 | Tsunoda | ................. H01L 23/467 |
| 2022/0142013 A1* | 5/2022 | Zhou | ........................ F28F 3/12 |
| | | | 361/702 |

FOREIGN PATENT DOCUMENTS

| | | |
|---|---|---|
| DE | 102007052397 A1 | 5/2009 |
| DE | 102010001958 A1 | 8/2011 |
| DE | 112019001566 T5 | 4/2022 |

OTHER PUBLICATIONS

Deutsches Patent—UND Markenamt (German Patent and Trademark Office), Recherchbericht, (search in a related application), Mar. 9, 2022.

* cited by examiner

COOLING DEVICE FOR DISSIPATING HEAT

CROSS REFERENCE TO RELATED APPLICATIONS

This patent application claims the benefit of and priority on German Patent Application No. 10 2021 112 415.8 having a filing date of 12 May 2021.

BACKGROUND OF THE INVENTION

Technical Field

The present invention relates to a cooling device for dissipating heat from articles to be cooled, such as power electronic modules, having at least one preferably rigid, in particular solid heat sink, preferably composed of metal, in particular composed of aluminium, which is intended to absorb heat from one or more articles to be cooled, and having a cooling fluid chamber for accommodating cooling fluid, in particular cooling liquid, to which the heat of the heat sink can be transferred.

Prior Art

In the case of cooling devices having a heat sink with a planar or flat heat absorption side which should, during use of the cooling device, be arranged as close as possible—optionally in direct contact or with the interposition of an intermediate layer composed of heat-conducting material, in particular heat-conducting paste—to a (for example likewise flat) heat emission side of the article to be cooled in order to optimize the heat transfer, the situation often arises that either the heat sink or the planar heat absorption side thereof has to be simultaneously arranged on a plurality of articles to be cooled whose heat emission sides run in different planes on account of different respective height dimensions of the articles, or that the heat sink or the heat absorption side thereof has to be arranged on a heat emission side of an individual article to be cooled that does not run in a continuously planar manner.

In both cases, distances which are relatively large in certain regions and which are unfavourable for efficient heat transfer may arise between, on the one hand, the heat emission side or sides of the article or articles to be cooled and, on the other hand, the planar heat absorption side of the heat sink, which has a detrimental effect on the cooling performance of the cooling device.

For this reason, use is made in part of heat-conducting pastes of relatively large layer thicknesses in order to bridge the corresponding distances which are otherwise filled only by air which has poor thermal conductivity. However, this solution is not optimal. Inter alia because the usable heat-conducting pastes generally have a lower thermal conductivity than the metal of the heat sink.

BRIEF SUMMARY OF THE INVENTION

Proceeding therefrom, it is an object of the present invention to further develop a cooling device of the type mentioned in the introduction.

This object is achieved by means of a cooling device for dissipating heat from articles to be cooled, such as power electronic modules, having at least one preferably rigid heat sink which consists in particular of solid material, preferably composed of metal, for example composed of aluminium, and which is intended to absorb heat from one or more articles to be cooled, and having a cooling fluid chamber for accommodating cooling fluid, in particular cooling liquid, to which the heat absorbed by the heat sink can be transferred, characterized in that the cooling device has at least two preferably rigid heat sinks which consist in particular of solid material and which are connected to one another in an articulated manner, in particular by way of a heat sink joint, in such a way that the two heat sinks are movable relative to one another in different, in particular parallel planes.

A cooling device of the type mentioned in the introduction according to the invention is accordingly characterized in that the cooling device has at least two preferably rigid heat sinks which consist in particular of solid material and which are preferably connected to one another in an articulated manner, by way of a heat sink joint which is arranged in particular between them, in such a way that the two heat sinks are movable relative to one another in different, in particular parallel planes.

As a result of the use of two heat sinks which are connected with one another in an articulated manner, and thus also two heat absorption sides which are connected in this way and which can be arranged on the respective article to be cooled, a cooling device is provided which can in particular compensate for relatively large tolerances or distances between the respective heat absorption side and the heat emission side or sides of the article or articles to be cooled, which tolerances or distances may otherwise arise due to the fact that, in the case of multiple separate heat emission sides, the latter do not run in a common plane, or due to the fact that, in relation to a respective heat emission side, the latter has individual surface regions which run in different planes.

Consequently, according to the invention, it is advantageously at least not necessary (any longer) to have to use heat-conducting paste of large layer thickness in order to bridge in particular such relatively large distances, which, as a result, leads to greater cooling performance of the cooling device according to the invention compared with the solutions of the prior art. However, it goes without saying that it is of course still possible to also insert heat-conducting paste between the aforementioned sides in the solution according to the invention, in particular in order to compensate for relatively small tolerances that may result, for example, from the respective structure of the otherwise planar heat emission sides.

In a further specific implementation of this concept, the heat absorption side of each heat sink, said heat absorption side being intended to be arranged on the respective article to be cooled during use of the cooling device, may in each case have a heat absorption surface which is formed in particular by the respective underside of the respective heat sink, wherein the heat absorption surfaces of the individual heat sinks are movable relative to one another in different planes.

During the relative movement of the heat sinks (about the articulated connection), the heat absorption surface of the respective one heat sink can then by definition be moved relative to the heat absorption surface of the respective other heat sink.

It goes without saying that the cooling device may also have multiple pairs of heat sinks which are each connected to one another in such an articulated manner.

By way of example, at least three heat sinks or two pairs of heat sinks could be provided, with a central heat sink which is connected in an articulated manner to a first outer heat sink on a first side (of the central heat sink) so as to form a first pair and which is connected in an articulated manner to a second outer heat sink on a second side (of the central heat sink) so as to form a second pair.

With regard to the or each heat sink joint, it may thus have two in particular parallel axes of rotation which are spaced apart from one another and about which the two heat sinks are movable, specifically pivotable, relative to one another in the different planes.

In a particularly preferred embodiment, the or each heat sink joint has a flexible, in particular pliable, (in particular thin-walled) joint portion of preferably plate-like form which (in particular on two sides in each case) is either integrally connected to the two heat sinks and has a smaller material thickness than the two heat sinks that are connected in an articulated manner by the joint portion, or (in particular on two sides in each case) is integrally connected to a base body, in particular composed of plastic, which is connected, in particular in a fluid-tight manner, to the two heat sinks that are connected in an articulated manner by the joint portion. The flexibility or deformability of the joint portion directly allows the heat sinks which are respectively connected thereto in an articulated manner to move in the different planes.

By way of example, the heat sinks could be placed, with heat absorption surfaces that are initially arranged in a common plane, onto articles to be cooled of different height and then pressure could be applied to the heat sinks in the direction of the articles to be cooled, such that the heat absorption surfaces move relative to one another, compensate for the different heights of the articles to be cooled by deformation of the joint portion, for example in the region of edges of same, and thus lie, in each case without any distance, against the articles to be cooled, in particular against the respective heat emission side of the respective article to be cooled.

Provision may furthermore be made for the flexible joint portion to in each case adjoin, on two opposite sides, one of two connecting portions to which the joint portion is in each case integrally connected, wherein each of the two connecting portions is in turn integrally connected to one of the two heat sinks, wherein the thickness of each connecting portion in its region adjoining the joint portion corresponds to the thickness of the joint portion and wherein the thickness thereof proceeding therefrom in the direction of the heat sink to which it is integrally connected increases in particular in a continuous manner until it corresponds to the thickness of this heat sink.

Moreover, the two above-mentioned axes of rotation of the or each heat sink may preferably be arranged in the region of the opposite sides or on the opposite sides of the joint portion, which each adjoin the respective connecting portion.

In a further preferred embodiment of the invention, the cooling device may have means for applying force which generates the relative movement of the two heat sinks in the different planes and which acts on the respective heat sink.

These means for applying the force may comprise a clamping device in which the heat sinks can be clamped between a first, in particular movable, clamping component and a second, in particular positionally fixed, clamping component. This is preferably effected such that the heat sinks, in particular the respective heat absorption surface of the respective heat sink, respectively bear against or are arranged on one or more articles to be cooled which can be arranged between the two clamping components.

Preferably, the first clamping component may be pushed against the heat sinks by means of spring force. Alternatively or in addition, the first clamping component may be designed to apply spring force to the heat sinks composed of elastic material.

Provision may furthermore be made for each heat sink to be connected in a fixed and fluid-tight, in particular liquid-tight, manner to a or the common base body which is preferably formed from plastic, in particular on that side of the heat sink which faces away from the respective heat absorption surface, wherein the respective heat sink and the base body together completely or partially enclose the cooling fluid chamber or delimit it towards the outside.

Provision may furthermore be made for the cooling fluid chamber to be formed from a plurality of fluid lines which are each introduced into the heat sinks, in particular milled into the heat sinks, or to comprise such fluid lines.

BRIEF DESCRIPTION OF THE DRAWINGS

Further features of the present invention will emerge from the attached patent claims, from the following description of preferred exemplary embodiments and from the attached drawings.

In the drawings.

DETAILED DESCRIPTION OF PREFERRED EMBODIMENTS

The cooling device 10 shown in the figures is used to dissipate heat from articles 11 to be cooled, in the present case power electronic components (for instance inverter modules) as are used for example in connection with batteries or rechargeable batteries of electric vehicles. However, the type of articles to be cooled is not of importance according to the invention.

The cooling device 10 has a lower heat sink 12 on which the articles 11 to be cooled are arranged or situated and which cools, or absorbs heat from, the undersides of the articles 11 to be cooled, and also has a plurality of, in the present case three, upper heat sinks 20, 21, 22 which each bear against the top sides of the articles 11 to be cooled and cool said articles or absorb heat from the top sides thereof.

In the present case, the lower heat sink 12 and the upper heat sinks 20, 21, 22 are each in the form of solid metal bodies, for example composed of aluminium.

The lower heat sink 12 is part of a lower cooling component 14 which has, in its interior (not shown), a cooling fluid chamber which is delimited towards the outside by the lower heat sink 12 and a base body which is produced for example from plastic, wherein the lower heat sink 12 and the base body assigned thereto are connected to one another (for instance in a materially bonded manner) in a fluid-tight, in the present case liquid-tight, manner. In the figures, for the sake of simplicity, the lower heat sink 12 of the lower cooling component 14 and the base body thereof are not depicted in individually resolved fashion in the drawings, but rather are illustrated as a complete unit or complete block.

The upper heat sinks 20, 21, 22 are part of an upper cooling component 15 which also has, in its interior, a cooling fluid chamber (not illustrated) which is delimited towards the outside on the one hand by the upper heat sinks 20, 21, 22 and on the other hand by a base body 19 which is for example also produced from plastic and which is assigned to these upper heat sinks 20, 21, 22. The upper heat sinks 20, 21, 22 and the base body 19, which is collectively assigned thereto, of the upper cooling component 15 are also connected to one another (for instance in a materially bonded manner) in a fluid-tight, in the present case likewise liquid-tight, manner.

One or both cooling fluid chambers may for example consist of or comprise a plurality of fluid lines which are introduced, in particular milled, into the respective heat sinks 12 and 20, 21, 22.

In the present case, the lower cooling component 14 and the upper cooling component 15, more precisely the cooling fluid chambers of same, are connected to one another in a fluid-conducting manner by way of laterally arranged connecting lines 16 which run in particular perpendicularly with respect thereto.

The cooling device 10 furthermore has a medium inlet 17 and a medium outlet 18.

As a result, it is correspondingly possible for cooling fluid, which during operation of the cooling device 10 can dissipate the (waste) heat that the heat sinks 12 and 20, 21, 22 absorb from the articles 11 to be cooled, to be supplied via the medium inlet 17 initially to the lower cooling component 14 and subsequently also to the upper cooling component 15.

As a rule, the cooling fluid will be a cooling liquid. However, it goes without saying that it is also within the scope of the invention to use a gaseous medium as cooling fluid. The corresponding fluid-tight connections between the respective base body and the lower heat sink 12 and, respectively, the upper heat sinks 20, 21, 22 would then correspondingly have to be of gas-tight form.

According to the invention, the upper heat sinks 20, 21, 22 are in each case in particular connected to one another in pairwise fashion in an articulated manner, such that they are movable relative to one another. In this case, a first pair of the upper heat sinks 20, 21 are connected to one another in an articulated manner by way of a first heat sink joint 23, and a second pair of the upper heat sinks 21, 22 are connected to one another in an articulated manner by way of a second heat sink joint 24.

Each upper heat sink 20, 21, 22 has a respective planar underside which forms an (outer) planar or flat heat absorption surface 25 which, during operation of the cooling device 10, bears against an opposite, in the present case likewise planar, heat emission surface 26, formed by the respective top side thereof, of the respective article 11 to be cooled or lies opposite said heat emission surface in a parallel manner, wherein, if necessary, heat-conducting paste may also be arranged between the heat absorption surface 25 and the heat emission surface 26, said heat-conducting paste inter alia compensating for minor unevennesses in the surfaces 25 and/or 26 and thus establishing optimal heat conduction between these surfaces.

The articulated connections of the upper heat sinks 20, 21, 22 make a particular tolerance compensation possible during abutment or arrangement of the respective upper heat sink 20, 21, 22 on the articles 11 to be cooled, as will be explained in more detail below.

Specifically, this for example also makes it possible to compensate for slightly larger differences in the height dimensions of the individual articles 11 to be cooled, the compensation of which for instance by means of heat-conducting paste would have an (excessively) adverse effect, on account of the layer thicknesses required therefor, with regard to the most optimized heat conduction possible.

In such a case of relatively large height differences (but also in other useful cases), it is then possible for the individual planar heat absorption surfaces 25 of the respective upper heat sinks 20, 21, 22 to be moved in different planes, such that, in spite of heat emission surfaces 26 of the articles 11 to be cooled that do not run in a common plane, said heat absorption surfaces then still lie directly opposite that (planar) heat emission surface 26 of the respective article 11 to be cooled which is respectively assigned thereto, in each case only with the smallest possible distance, if any, from said heat emission surface.

As has already been indicated above, the required movability between the individual upper heat sinks 20, 21, 22 is made possible by the heat sink joints 23 and 24.

Figure 3:
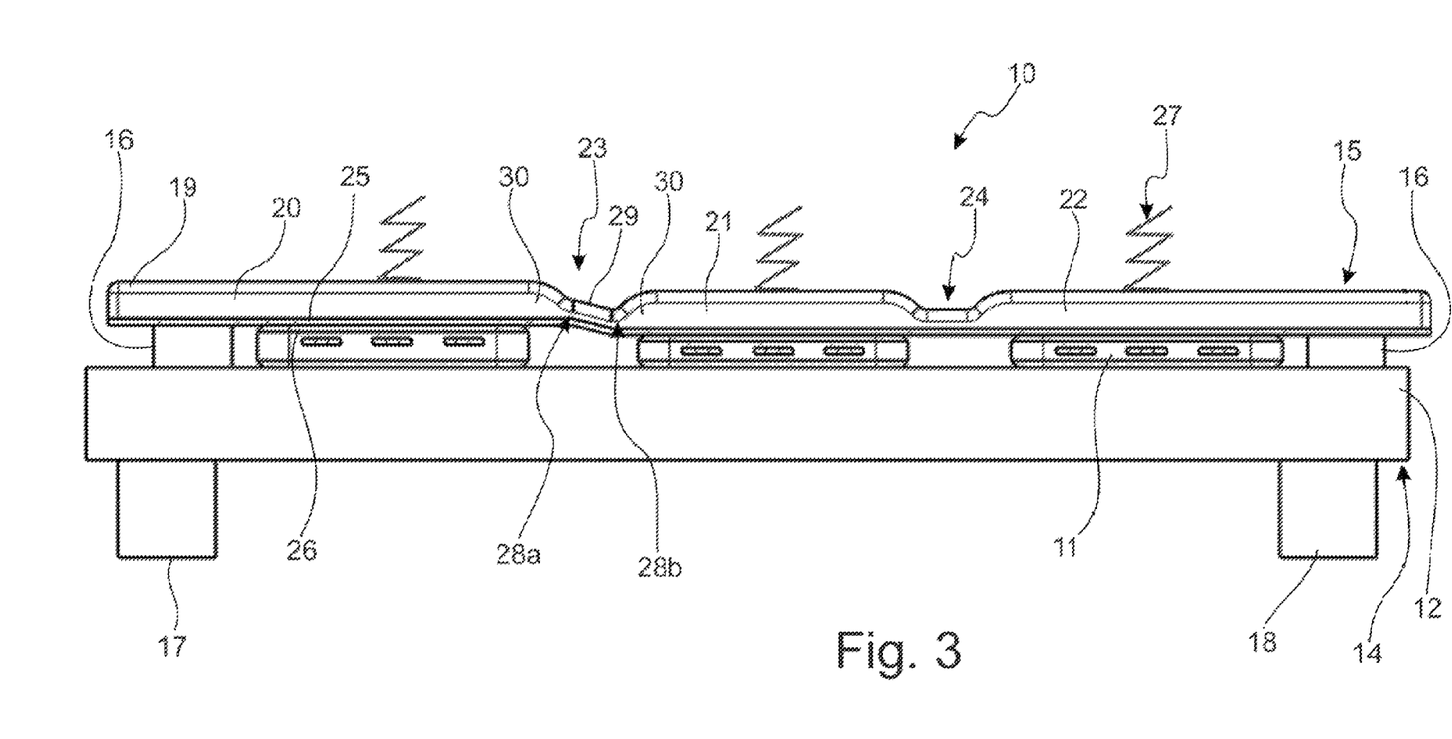
FIG. 3 shows a cooling device according to the invention in a side view similar to the illustration in FIG. 2 with three articles to be cooled, one of which has a greater height than the other two.

For further elucidation, FIG. 3 shows a situation in which one of the articles 11 to be cooled, namely the left-hand outer article 11 to be cooled, has a greater height than the two other articles 11 to be cooled. Correspondingly, the heat emission surface 26 thereof runs in a different (higher) plane than the heat emission surfaces 26 of the two other articles 11 to be cooled.

Figure 1:
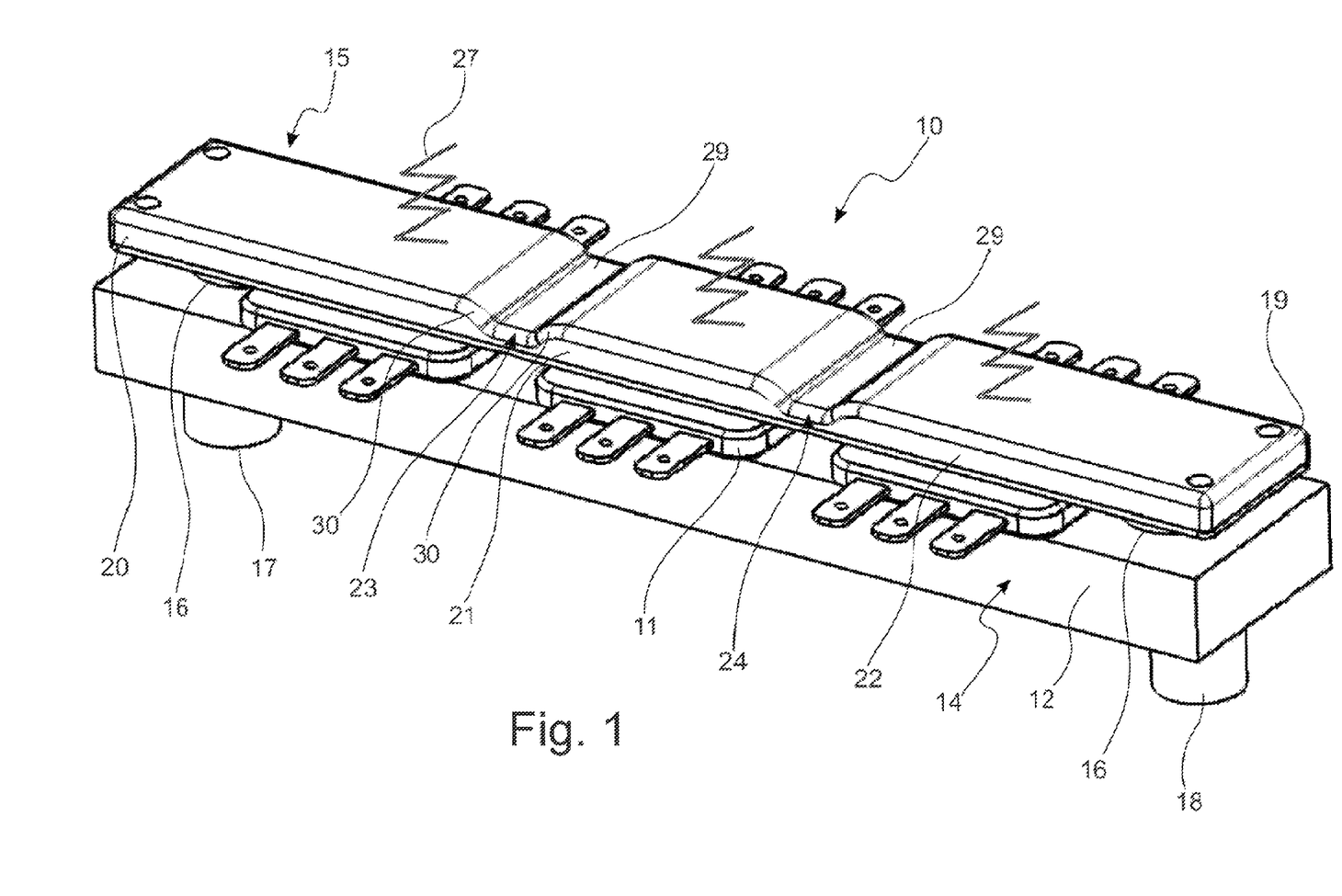
FIG. 1 shows an oblique view of a cooling device according to the invention with three articles to be cooled of identical height.

In order to compensate for this, the upper cooling component 15 has been deformed in comparison with the situation of FIG. 1, in which all the heat absorption surfaces 25 of the upper cooling component 15 or of the upper heat sinks 20, 21, 22 lie in a common plane, by application of pressure onto the upper cooling component 15 or directly onto the upper heat sinks 20, 21, 22. Forces 27 are schematically indicated which act from above on the upper cooling component 15 or correspondingly on the upper heat sinks 20, 21, 22 in order to bring about this deformation.

Specifically, these forces 27 act on the individual upper heat sinks 20, 21, 22 and in particular ensure a relative movement between the outer upper heat sink 20 and the adjacent, central upper heat sink 21.

For this purpose, the first and the second heat sink joint 23 and 24, respectively, each comprise a joint portion 29 which is integrally connected to the upper heat sinks 20, 21, 22 and which is for example of plate-like form. Said joint portion has a significantly smaller material thickness than the two upper heat sinks 20, 21 or 21, 22, respectively, that are connected to one another in an articulated manner by the respective heat sink joint 23 or 24, respectively.

In this case, the (smaller) material thickness is selected in such a way that the respective joint portion 29 is flexible (deformable) or pliable overall. Formed in the region of opposite sides of the respective joint portion 29 are in each case defined, parallel axes of rotation 28a and 28b which are spaced apart from one another, which in the present case run parallel to the plane of the respective heat absorption surface 25 and about which the heat sinks 20, 21, 22 can each be rotated (by deformation of the joint portion 29 in this region).

Moreover, in the region of the two opposite sides of the respective joint portion 29, the latter in each case adjoins a connecting portion 30 which is integrally connected to the two upper heat sinks 20, 21 or 21, 22, respectively, of a pair of adjacent heat sinks 20, 21, 22 and the thickness of which in its region adjoining the joint portion 29 corresponds to the thickness of the joint portion 29 and the thickness of which proceeding therefrom in the direction of the respective heat sink 20, 21 or 22 increases in particular in a continuous manner until it corresponds to the thickness of the heat sink 20, 21 or 22.

With regard to the above-mentioned relative movement between the outer upper heat sink 20 and the adjacent, central upper heat sink 21, said relative movement thus allows for corresponding orientation or movement of the individual heat sinks 20 and 21 in such a way that subsequently both the heat absorption surface 25 of the outer upper heat sink 20 and the heat absorption surface 25 of the central upper heat sink 21 bear in each case against that heat emission surface 26 of the respective article 11 to be cooled which is assigned thereto (FIG. 3).

In the present example, the aforementioned forces 27 are applied by a clamping device (not illustrated) in which the lower and the upper cooling component 14 and 15, respectively, together with the articles 11 to be cooled which are arranged between them, are clamped between a first, in particular movable, clamping component preferably in the form of a spring and a second, in particular positionally fixed, clamping component.

Moreover, provision may also be made for the lower cooling component 14 to simultaneously form the second, positionally fixed clamping component, for example.

Figure 2:
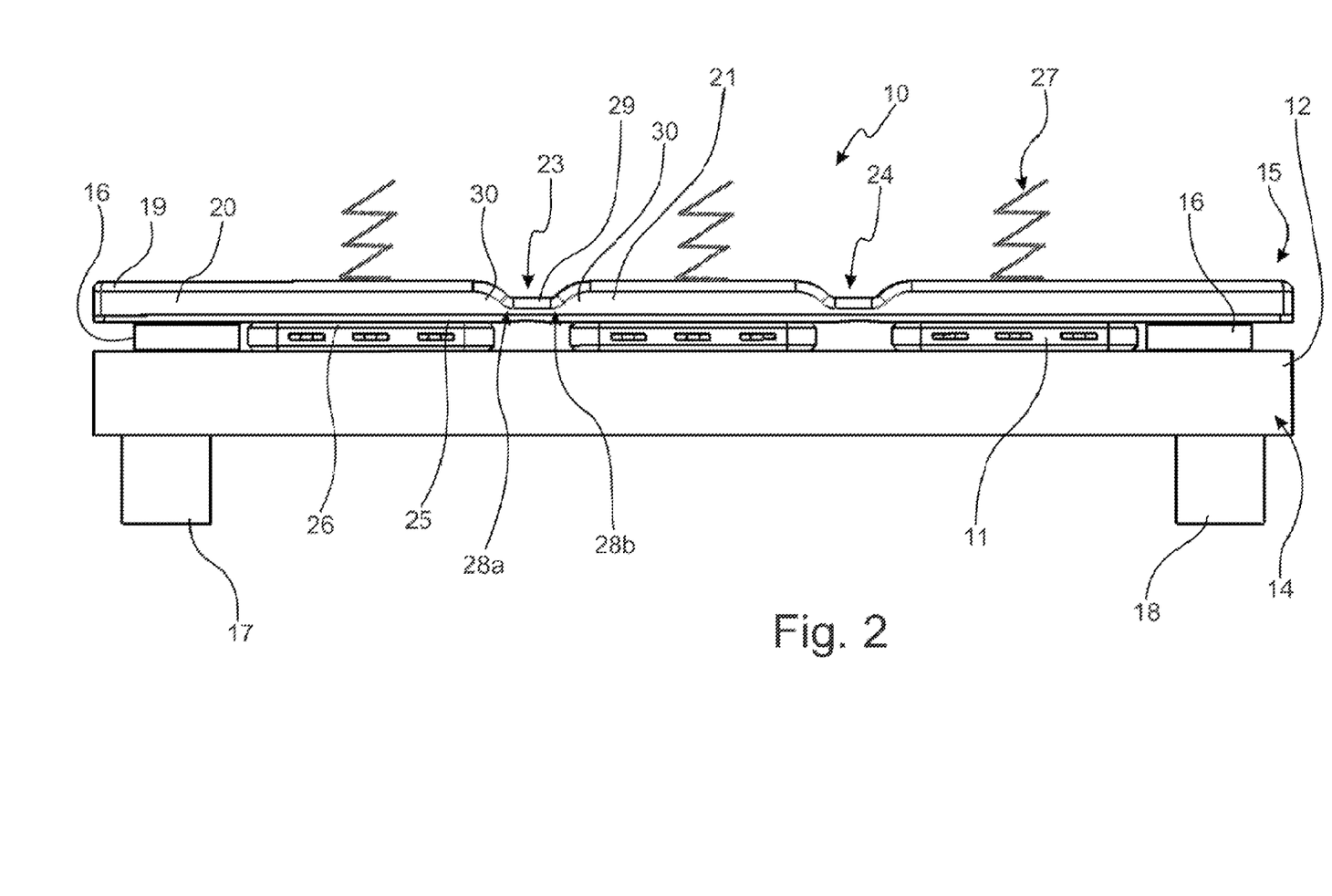
FIG. 2 shows a side view of the cooling device from FIG. 1.
Figure 4:
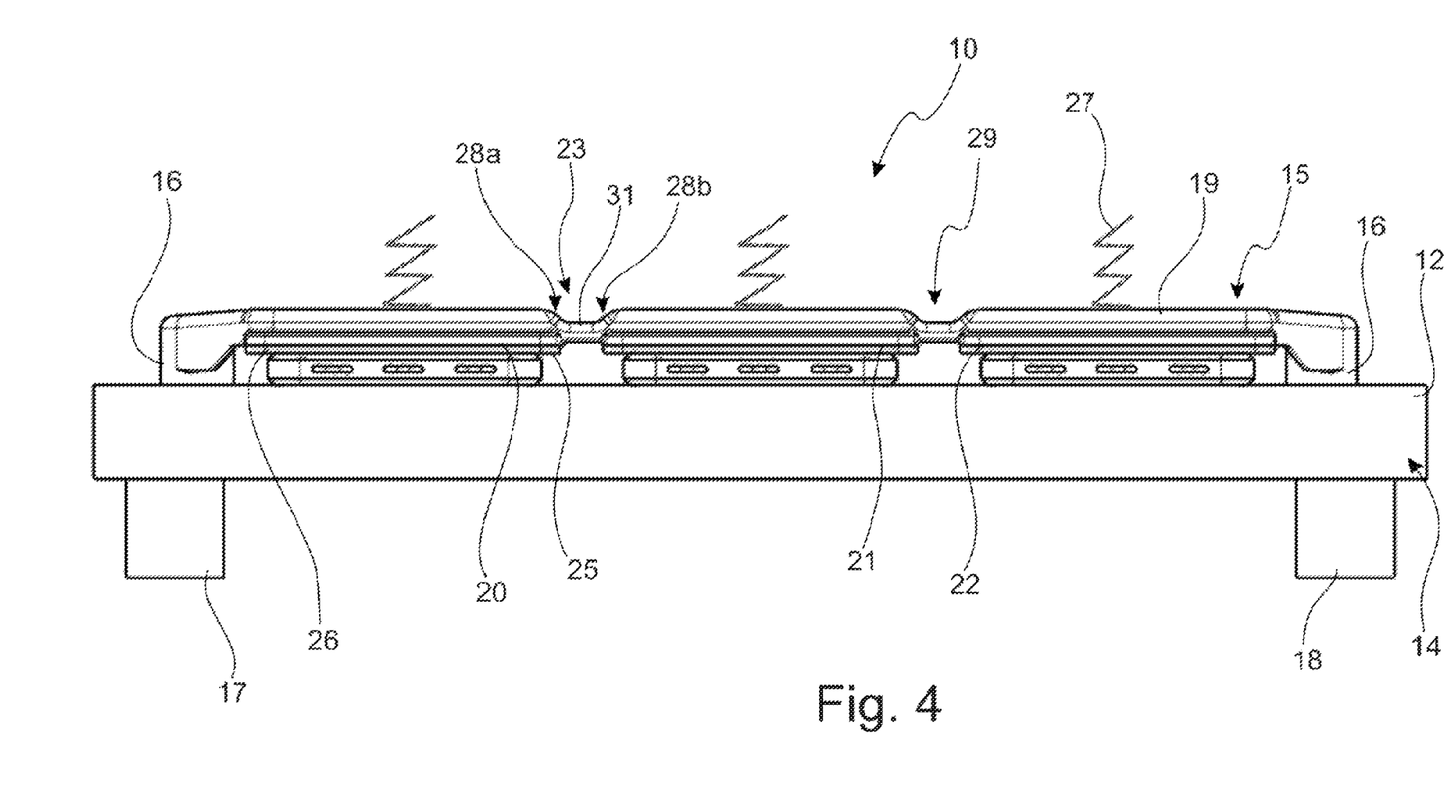
FIG. 4 shows a further embodiment of a cooling device according to the invention in a side view similar to FIG. 2.

FIG. 4 shows an embodiment of a cooling device 10 according to the invention in which the individual heat sinks 20, 21, 22 are connected to one another in an articulated manner in a different way than in FIGS. 1-3. Specifically not directly by way of a joint portion 29 or connecting portion 30 which is integrally connected thereto, but only indirectly by way of a flexible joint portion 31 which is arranged between the pairs of heat sinks 20, 21 and 21, 22, respectively, and which in this case forms part of or is integrally connected to the plastics base body 19 which is connected (in a fluid-tight manner) to the upper heat sinks 20, 21, 22.

In this case, insofar as material is concerned, the upper heat sinks 20, 21, 22 are separate or separately produced components which have been or are connected to one another (only) by the common base body 19, whereas in the embodiment of FIGS. 1-3 they are produced from a common material or metal block into which the connecting portions 30 or the joint portions 29 have been or are incorporated by suitable machining of the material block, such that the upper heat sinks 20, 21, 22 are correspondingly integrally connected to one another as a result.

LIST OF REFERENCE DESIGNATIONS

10 Cooling device
11 Article to be cooled
12 Lower heat sink
14 Lower cooling component
15 Upper cooling component
16 Connecting line
17 Medium inlet
18 Medium outlet
19 Base body of upper cooling component
20 Outer upper heat sink
21 Central upper heat sink
22 Outer upper heat sink
23 First heat sink joint
24 Second heat sink joint
25 Heat absorption surface
26 Heat emission surface
27 Force
28a Axis of rotation
28b Axis of rotation
29 Joint portion
30 Connecting portion
31 Joint portion

What is claimed is:

1. A cooling device for dissipating heat from articles to be cooled, such as power electronic modules, having:
   an upper cooling component having a first cooling fluid chamber and a lower cooling component having a second cooling fluid chamber;
   at least two rigid upper heat sinks which consist of solid material and which are intended to absorb heat from one or more articles to be cooled, wherein the at least two rigid upper heat sinks are part of the upper cooling component; and
   a lower heat sink, wherein the lower heat sink is part of the lower cooling component,
   wherein the first cooling fluid chamber is for accommodating a cooling liquid, to which heat absorbed by the at least two rigid upper heat sinks can be transferred,
   wherein the at least two rigid upper heat sinks are connected to one another in an articulated manner by way of a heat sink joint whereby the at least two rigid upper heat sinks are movable relative to one another in different, parallel planes,
   wherein the heat sink joint has a flexible joint portion which is integrally connected to a base body composed of plastic that is connected to the at least two rigid upper heat sinks, whereby the first cooling fluid chamber of the upper cooling component and the second cooling fluid chamber of the lower cooling component are connected to one another in a fluid conducting manner by way of laterally arranged connecting lines.

2. The cooling device according to claim 1, wherein the heat sink joint has two parallel axes of rotation which are spaced apart from one another and about which the at least two rigid upper heat sinks are pivotable relative to one another in the different planes.

3. The cooling device according to claim 2, wherein the flexible joint portion adjoins, on two opposite sides, two connecting portions to which the flexible joint portion is integrally connected, wherein each of the two connecting portions is in turn integrally connected to a respective one of the at least two rigid upper heat sinks, and wherein a thickness of each of the connecting portions in a region adjoining the flexible joint portion corresponds to a thickness of the flexible joint portion and wherein the thickness of the flexible joint portion proceeding from the flexible joint portion in the direction of a respective one of the rigid upper heat sinks to which the flexible joint portion is integrally connected increases in a continuous manner until the thickness of the flexible joint portion corresponds to the thickness of the respective one of the rigid upper heat sinks.

4. The cooling device according to claim 3, wherein the two axes of rotation of the heat sink joint are arranged in a region of the opposite sides of the flexible joint portion, which each of the opposite sides of the flexible joint portion adjoin a respective connecting portion.

5. The cooling device according to claim 1, wherein the cooling device has means for applying force which generates the relative movement of the at least two rigid upper heat sinks in different planes and which acts on a respective one of the rigid upper heat sinks.

6. The cooling device according to claim 1, wherein each of the at least two rigid upper heat sinks has a planar heat absorption surface for abutment against or arrangement on a respective article to be cooled, and in that each of the at least two rigid upper heat sinks is movable by way of the heat sink joint in different planes in such a way that the planar heat absorption surface of each of the at least two rigid upper heat sinks can be arranged in different planes which run parallel to and at a distance from one another.

7. The cooling device according to claim 6, wherein each of the at least two rigid upper heat sinks is connected in a fixed and liquid-tight manner to the base body on a side of each of the at least two rigid upper heat sinks which faces away from the heat absorption surface, wherein a respective one of the rigid upper heat sinks and the base body together completely or partially enclose the cooling fluid chamber or delimit it towards outside.

8. The cooling device according to claim 1, wherein the cooling device has multiple pairs of rigid upper heat sinks which are each connected to one another in an articulated manner by way of a heat sink joint in such a way that each of the rigid upper heat sinks in the pairs of the rigid upper heat sinks are movable relative to one another in different parallel planes.

9. The cooling device according to claim 1, wherein the articles to be cooled are power electronic modules.

10. The cooling device according to claim 1, wherein the solid material is metal.

11. The cooling device according to claim 10, wherein the metal is aluminum.

12. The cooling device according to claim 1, wherein the joint portion of the heat sink joint is of plate-like form.

13. The cooling device according to claim 12, wherein the plate-like form of the joint portion of the heat sink joint has a smaller material thickness than the two rigid upper heat sinks.

14. The cooling device according to claim 1, wherein the joint portion of the heat sink joint is connected to the two rigid upper heat sinks in a fluid-tight manner.

\* \* \* \* \*